(12) United States Patent
Schanen

(10) Patent No.: US 7,183,041 B2
(45) Date of Patent: Feb. 27, 2007

(54) PRINTING PLATE IN THE FORM OF A ROLLER AND METHOD FOR OBTAINING SAME

(75) Inventor: Michel Schanen, Guewenheim (FR)

(73) Assignee: Macdermid Graphic Arts S.A., Cernay (FR)

(*) Notice: Subject to any disclaimer, the term of this patent is extended or adjusted under 35 U.S.C. 154(b) by 0 days.

(21) Appl. No.: 10/148,980

(22) PCT Filed: Dec. 27, 2000

(86) PCT No.: PCT/FR00/03698

§ 371 (c)(1),
(2), (4) Date: Aug. 23, 2002

(87) PCT Pub. No.: WO01/49509

PCT Pub. Date: Jul. 12, 2001

(65) Prior Publication Data

US 2003/0059713 A1    Mar. 27, 2003

(30) Foreign Application Priority Data

Dec. 31, 1999  (FR) .................................. 99 16816

(51) Int. Cl.
*G03F 7/11* (2006.01)

(52) U.S. Cl. ............... 430/302; 430/271.1; 430/273.1; 430/281.1; 430/286.1; 430/306; 430/495.1; 430/501; 101/130; 101/463.1

(58) Field of Classification Search ............. 430/270.1, 430/271.1, 273.1, 281.1, 286.1, 287.1, 288.1, 430/302, 306, 495.1, 501; 101/130, 463.1
See application file for complete search history.

(56) References Cited

U.S. PATENT DOCUMENTS

| 4,293,635 | A  | * | 10/1981 | Flint et al. ............... 430/271.1 |
| 4,582,777 | A  |   | 4/1986  | Fischer ...................... 430/271 |
| 4,631,246 | A  |   | 12/1986 | Bennett ..................... 430/271 |
| 4,656,077 | A  | * | 4/1987  | Larimore et al. ........... 428/156 |
| 5,879,854 | A  |   | 3/1999  | Tomita et al. ............ 430/272.1 |
| 5,906,909 | A  |   | 5/1999  | Ellis ......................... 430/302 |
| 5,994,026 | A  | * | 11/1999 | DeBoer et al. .......... 430/270.1 |
| 6,057,079 | A  | * | 5/2000  | Shelnut .................. 430/272.1 |
| 6,268,109 | B1 | * | 7/2001  | Hill ......................... 430/273.1 |
| 6,455,231 | B1 | * | 9/2002  | Shelnut ..................... 430/306 |
| 2002/0064728 | A1 | * | 5/2002 | Weed et al. ............. 430/281.1 |
| 2003/0091926 | A1 | * | 5/2003 | Shelnut ..................... 430/258 |

FOREIGN PATENT DOCUMENTS

| DE | 3825782 | 2/1989 |
| EP | 0057593 | 8/1982 |
| EP | 0177302 | 4/1986 |
| EP | 0803773 | 10/1997 |
| EP | 0267807 | 5/1998 |

(Continued)

*Primary Examiner*—Barbara L. Gilliam
(74) *Attorney, Agent, or Firm*—Ladas and Parry LLP

(57) ABSTRACT

The invention concerns a printing plate in the form of a roller and a method for obtaining same. Said method consists in producing on a first layer, at least a photopolymer film and in coiling said layers on themselves to form a roller. The invention is applicable in flexographic or typographic printing.

20 Claims, 3 Drawing Sheets

FOREIGN PATENT DOCUMENTS

| | | |
|---|---|---|
| EP | 0905564 | 3/1999 |
| EP | 0916480 | 5/1999 |
| EP | 0940720 | 9/1999 |
| JP | 10333328 | 3/1999 |
| WO | 9640528 | 12/1996 |

* cited by examiner

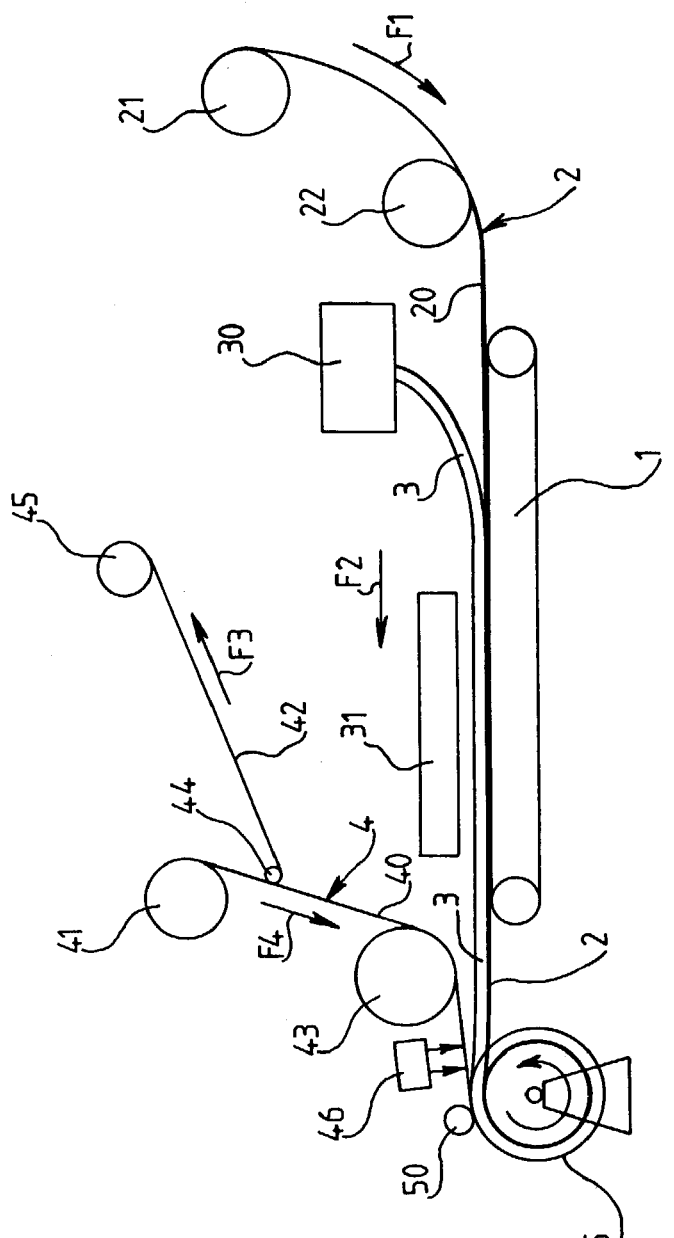
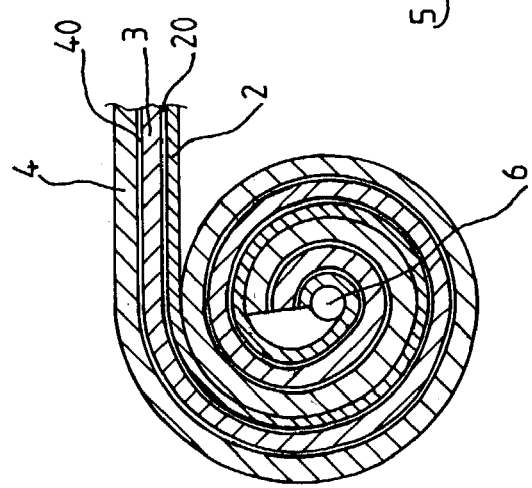

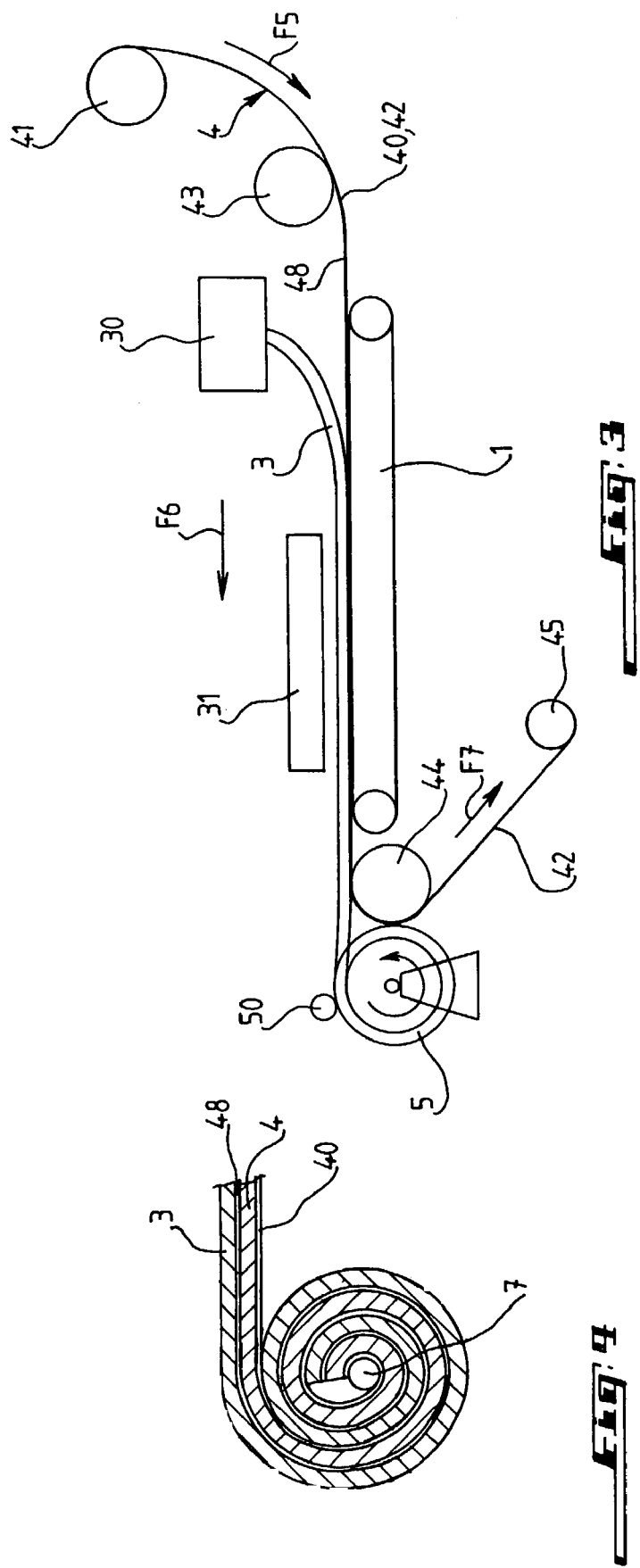

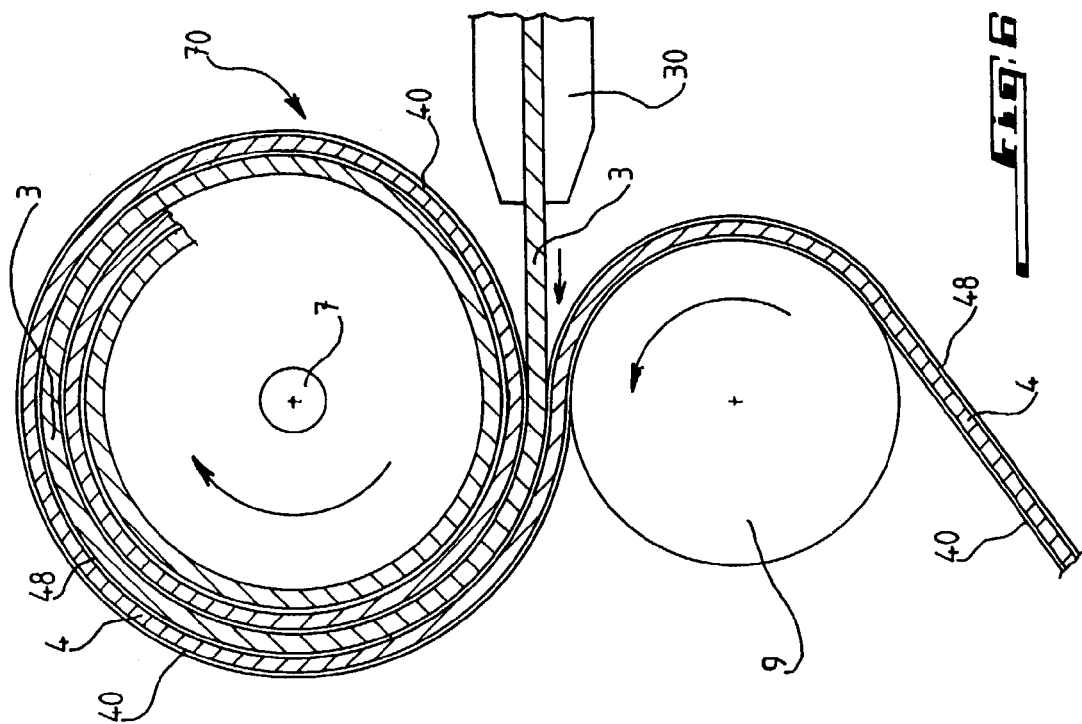
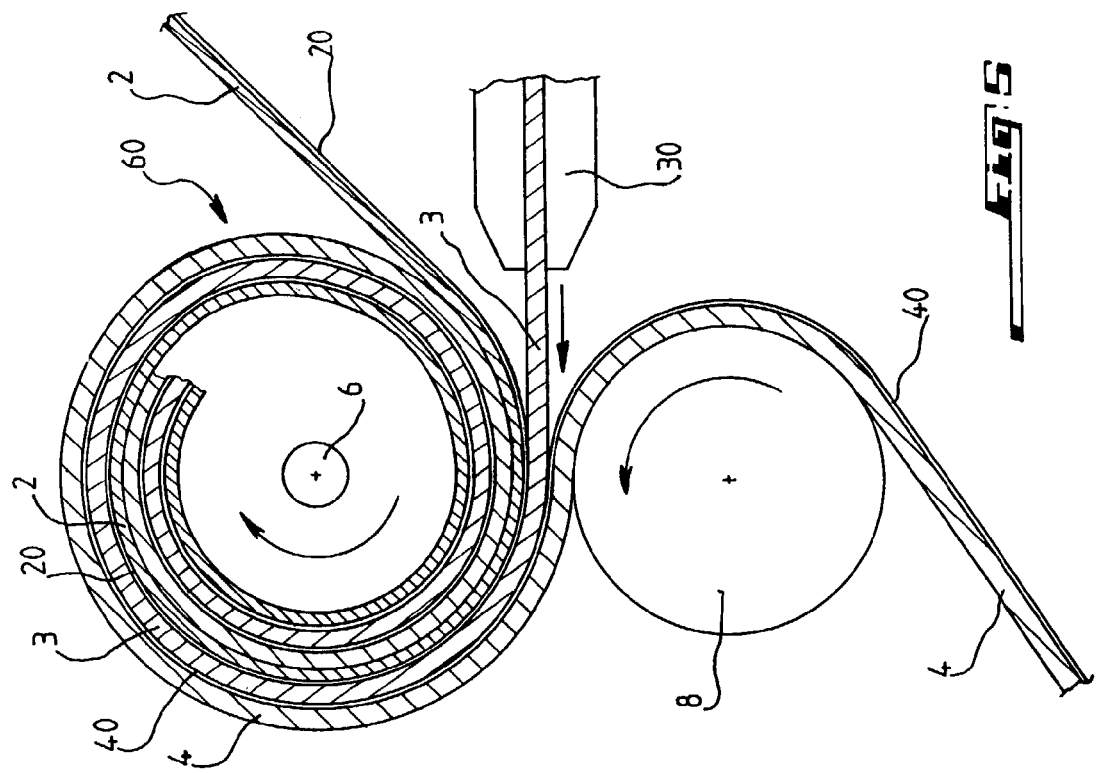

PRINTING PLATE IN THE FORM OF A ROLLER AND METHOD FOR OBTAINING SAME

The invention relates to the art of printing, and more particularly to printing plates used especially for flexographic or letterpress printing.

Such printing plates are intended to be positioned on a support cylinder of a printing machine.

There are known numerous printing plates which comprise a photopolymer layer placed on a support, which is generally a polyester film. In addition, the photopolymer layer is covered on its other face by a protective film.

Prior to use of the printing plate, the protective film is removed and the photopolymer layer is developed to receive the image to be printed. Such development comprises exposing the photopolymer layer to UV light through a mask, the unexposed zones of the photopolymer layer then being dissolved away by a solvent. As a result, there is obtained a layer with relief, which will make it possible to reproduce the image.

The printing plates known in the prior art are delivered in the form of sheets of particular size.

This sheet-type configuration is necessitated by the stack comprising the support layer, which is rigid (in the sense that it cannot be stretched), the photopolymer layer and the protective layer, which also cannot be stretched, this stack forming a complex which is rigid to flexion. It is also due to the process by which these plates are obtained. This in fact comprises extruding the photopolymer layer between two cylinders, which immediately generates a rigid layer.

This configuration results in large losses, of at least 10%, when the printers trim the plates to printing size before mounting them on the support cylinder of a printing machine.

These losses adversely impact the cost of printing plates.

Furthermore, plates configured as sheets run the risk of being damaged, especially at the surface, due to incorrect handling during their transportation and storage.

For this reason the manufacturers of printing plates have developed costly and cumbersome packages, often comprising cardboard boxes of different thicknesses as well as foamed materials, in order to protect the printing plates that they contain. In addition, a specific package must be designed for each particular size of printing plate, which further increases the space necessary for storage of these packages.

Finally, before being packaged or used, the printing plates are stored on different shelves, corresponding to their dimensions and their thickness. This requires considerable floor space, inasmuch as at least twenty plates of different thickness and size must generally be available.

The object of the invention is therefore to alleviate these disadvantages by breaking away from the usual sizes of sheet-type printing plates, in order to limit the losses during trimming, and also by providing a type of configuration that permits less space-consuming storage and that requires less costly packaging.

To this end, the invention relates to a process for obtaining a printing plate configured as a roll, wherein at least one photopolymer layer is formed on a first layer of a given material and the said layers are rolled up on themselves to form a roll.

In a first version, this process additionally comprises fixing a second layer on the face of the photopolymer layer opposite the said first layer, while simultaneously rolling up the assembly composed of the first layer, the photopolymer layer and the second layer as soon as the assembly is composed, to obtain a roll such that the first and second layers are in contact in the said roll.

Advantageously, the first layer is a protective film, while the second layer is a support layer, or vice versa.

A particular embodiment of this process comprises depositing on the photopolymer layer at least one other layer, and especially a compressible layer, prior to fixation of the said second layer on the said other layer.

Advantageously, this process also comprises coating the protective film with a layer of anti-adhesive material, which is brought into contact with the photopolymer layer, during or after deposition of the said first layer on the photopolymer layer.

Preferably the support layer comprises a polyester sheet, which is coated with a pressure-sensitive bonding material intended to come into contact with the photopolymer layer.

In a second version, the process comprises rolling up the assembly comprising the photopolymer layer and the support layer such that, in the roll, the photopolymer layer is fixed on the first layer rolled up directly onto it or just before it, the said first layer serving as both support and protection for the photopolymer layer.

In a preferred embodiment, the first layer is a support layer provided with a layer of pressure-sensitive bonding material on its face opposite the photopolymer layer, such that, during the rolling-up, the photopolymer layer is fixed by virtue of the said bonding material on the support layer rolled up directly onto it or just before it.

In a particular embodiment, this process additionally comprises depositing, on the photopolymer layer, at least one other layer, and especially a compressible layer, before the actual rolling-up is performed.

Advantageously, this process also comprises depositing a layer of anti-adhesive material on the support layer before the photopolymer layer is formed on this layer of anti-adhesive material.

In all embodiments of this process according to the invention, the photopolymer layer is advantageously obtained by extrusion, then calendered.

In addition, the protective film is preferably made of polyester.

The invention also relates to a printing plate configured as a roll, comprising in succession a protective film, at least one photopolymer layer and one support layer, such that, in the said roll, the support layer is in contact with the said protective film.

This printing plate is advantageously provided with a layer of anti-adhesive material between the protective film and the photopolymer layer.

It is also provided with a layer of pressure-sensitive bonding material between the photopolymer layer and the support layer.

The invention also relates to a printing plate configured as a roll and comprising in succession a photopolymer layer and a support and protective layer, such that, in the said roll, the photopolymer layer is in contact on both of its faces with the support and protective layer.

Preferably there is provided on the support and protective layer a layer of bonding material, by means of which the photopolymer layer is fixed on the support layer, the said layers being disposed successively in the following pattern in the roll: layer of bonding material, support layer and photopolymer layer.

In another preferred embodiment, the printing plate according to the invention comprises a layer of anti-adhesive material between the support layer and the photopolymer layer, the different layers being disposed successively in the following pattern: layer of bonding material if present, support layer, layer of anti-adhesive material and photopolymer layer.

The invention will be better understood and other objectives, advantages and characteristics thereof will become clearer upon reading the description provided hereinafter with reference to the attached drawings, wherein:

FIG. 1 schematically illustrates an installation permitting the use of a first version of the process according to the invention;

FIG. 2 is a sectional view of a roll-type printing plate obtained by the process described with reference to FIG. 1;

FIG. 3 is a schematic view of an installation permitting the use of a second version of the process according to the invention;

FIG. 4 is a sectional view of a printing plate having the form of a roll, obtained by the process described with reference to FIG. 3;

FIG. 5 schematically illustrates another installation permitting the use of the first version of the process according to the invention; and FIG. 6 schematically illustrates another installation permitting the use of the second version of the process according to the invention.

Referring first of all to FIG. 1, reference symbol 1 denotes a conveyor belt or appropriate support and transportation means, on which is deposited a protective film 2.

This protective film is fed from a supply roll 21, and it is guided as far as conveyor 1 by a second roll 22. The travel direction of the protective film is schematically indicated by arrow F1.

Onto this protective film 2 there is extruded a photopolymer layer 3 by appropriate means 30.

The process according to the invention is of course not limited to this embodiment of the photopolymer layer, which can also be obtained by other means, in particular by coating.

Protective film 2 and photopolymer layer 3 are displaced by conveyor 1 in translational motion, indicated schematically by arrow F2.

The protective film and the photopolymer layer then pass under heating means 31 of infrared type, whose function is to heat the photopolymer layer slightly to make it more tacky.

These means 31 do not absolutely have to be provided, but they make it possible to reactivate the external surface of the photopolymer layer, thus promoting fixation thereof on support layer 4, which will now be described.

This support layer 4 is drawn from a feed roll 41.

On roll 41, support layer 4 is provided with a silicone film 42, which is removed from the support layer, guided by roll 44 and rolled up onto an appropriate support 45. The travel direction of silicone sheet 42 is schematically indicated by arrow F3.

Support layer 4 in turn is conducted up to the upper part of a coiling mechanism 5 by guide means 43. The displacement of support sheet 4 is illustrated by arrow F4.

At the upper part of coiling mechanism 5, support layer 4 comes into contact with photopolymer layer 3 deposited on protective film 2.

Preferably support layer 4 is provided, on its face opposite the photopolymer layer, with a layer 40 of pressure-sensitive bonding material.

Thus, by virtue of the pressure exerted by roll 50 provided in the upper part of coiling mechanism 5, support layer 4 is securely fixed to photopolymer layer 3.

This fixation is promoted by slight heating of support layer 4, achieved, for example, by infrared heating means 46.

The process according to the invention is of course not limited to this embodiment, and the fixation between the photopolymer layer and the support layer could be achieved by other means, such as specialized UV-curing adhesives.

As soon as the assembly formed by protective film 2, photopolymer layer 3 and support layer 4 is composed, this assembly is progressively rolled up on coiling mechanism 5.

The printing plate configured as a roll and obtained in this way will be described with reference to FIG. 2.

It may also be noted that protective film 2 can be provided on its face intended to be in contact with photopolymer layer 3 with a layer 20 of anti-adhesive material, commonly known as "slip film".

As indicated above, the protective film is removed from the printing plate prior to development of the photopolymer layer.

Such development is generally accomplished by positioning a mask or negative on the photopolymer layer. This layer is slightly tacky. Thus, once the mask has been set in place, it cannot always be easily removed from the photopolymer layer, for example to reposition it correctly.

For this reason, this layer of anti-adhesive material is generally provided on the protective film. This layer of anti-adhesive material remains fixed to the photopolymer layer after removal of the protective film. It then facilitates removal of the mask from the photopolymer layer at the appropriate time.

In addition, in the process just described, the first layer on which the photopolymer layer is formed is protective film 2, while the second layer, fixed to the photopolymer layer at a later stage, is support layer 4.

The invention is of course not limited to this embodiment, and photopolymer layer 3 could be formed on support layer 4, protective film 2 then being applied on the face of the photopolymer layer opposite the support layer while the assembly is being rolled up.

It is this embodiment that is illustrated in FIG. 5, which shows an alternative version of the installation illustrated in FIG. 1.

This installation is provided with a support 6 for roll 60 as it is being formed and with a cylinder 8 which guides support 4 provided with a layer 40 of bonding material. Support 6 and cylinder 8 turn in opposite directions.

Thus the photopolymer layer is extruded by means 30. Then, onto photopolymer layer 3, there are guided, on the one hand, protective film 2 with a layer 20 of anti-adhesive material from the interior side of roll 60 and, on the other hand, support layer 4 from the exterior side of roll 60.

Superposed layers 2, 20, 3, 40 and 4 are passed between cylinder 8 and roll 60, and become rolled up onto the roll while it is being formed.

Other installations capable of obtaining a plate in the form of a roll, as illustrated in FIG. 2, can certainly be envisioned.

Referring now to FIG. 2, there is shown, in section transverse to the axis, a printing plate according to the invention, configured as a roll obtained by means of the process described with reference to FIG. 1 or to FIG. 5.

This printing plate is therefore composed of four successive layers which, starting from support 6 of the roll, are protective film 2, layer 20 of anti-adhesive material, photopolymer layer 3, layer 40 of bonding material and support layer 4. The pattern represented by these five layers is repeated over the entire roll along a diameter thereof.

The different layers could of course be rolled up in the opposite direction, layer 4 then being in contact with support 6.

Thus, in the obtained printing plate, protective film 2 and support layer 4 are in contact.

As explained hereinabove, the invention is not limited to a printing plate provided with these five layers. In particular, the anti-adhesive material and/or the layer of bonding material could be left out. In addition, other layers could be deposited on the photopolymer layer prior to fixation of the last layer, support layer 4 or protective film 2. In particular, it is possible to envision depositing a layer of compressible material on photopolymer layer 3. This compressible layer could also be deposited in advance on support layer 4, before this support layer 4 provided with this compressible layer is brought into contact with photopolymer layer 3.

It is also possible to envision other layers such as digital layers or contrast layers which improve the transfer of ink, or pertinent combinations of such layers.

In addition, the protective film is usually a polyester while the layer of anti-adhesive material is usually made of polyamide or of cellulose.

Bonding coating 40 of layer 4 can in particular be made of a pressure-sensitive adhesive or a specialized UV-sensitive adhesive, while support layer 4 is made of polyester, for example.

Referring now to FIG. 3, there is illustrated an installation that permits the use of a second version of the process according to the invention.

On conveyor belt 1 there is deposited a support layer 4.

This support layer is fed from a supply roll 41, and it is guided up to conveyor 1 by a second roll 43. The travel direction of the support layer is indicated schematically by arrow F5.

In the illustrated example, support layer 4 is successively provided on its face intended to be in contact with conveyor 1 with a layer 40 of pressure-sensitive bonding material, in contact with the support layer itself, and with a silicone protective sheet 42, deposited on this layer of bonding material.

Onto this support layer 4, on the side opposite layers 40 and 42, there is extruded a photopolymer layer 3 by appropriate means 30.

As indicated hereinabove, the process according to the invention is not limited to this embodiment of the photopolymer layer, which could be obtained by any other means, and especially by coating.

Preferably, support layer 4 is provided on its face opposite layers 40 and 42 with a layer 48 of anti-adhesive material.

After deposition of photopolymer layer 3, support layer 4 and this layer 3 are displaced by conveyor 1 in translational motion, as indicated schematically by arrow F6.

Support layer 4 and photopolymer layer 3 are then passed under heating means 31 of infrared type, which again have the function of slightly heating the photopolymer layer so as to make it tackier.

As indicated hereinabove with reference to FIG. 1, these heating means do not absolutely have to be provided, but they make it possible to reactivate the external surface of the photopolymer layer. This promotes fixation thereof on support layer 4 produced during the rolling-up, as will now be described.

Before the support layer and the photopolymer layer arrive at coiling mechanism 5, the silicone film is removed from support layer 4. It is guided by roll 44 and rolled up on an appropriate support 45. The travel direction of silicone sheet 42 is indicated schematically by arrow F7.

Thus it is the assembly composed of photopolymer layer 3 and support layer 4, with its surface layer 40 of bonding material, that arrives at the upper part of coiling mechanism 5.

After this assembly has been rolled up for one complete turn on coiling mechanism 5, layer 40 of adhesive coating of the support layer comes in contact with previously rolled-up photopolymer layer 3.

By virtue of the pressure exerted by roll 50 provided at the upper part of coiling mechanism 5, support layer 4 is securely fixed on photopolymer layer 3, especially when the bonding material of layer 40 is pressure-sensitive.

Referring now to FIG. 4, there is shown, in section transverse to the axis, a printing plate in the form of a roll according to the invention, obtained by the process described with reference to FIG. 3.

This printing plate is therefore composed of four successive layers which, starting from support 7 of the roll, are layer 40 of bonding material, support layer 4, layer 48 of anti-adhesive material and photopolymer layer 3. This pattern is repeated over the entire roll along a diameter thereof.

Thus, in the obtained printing plate, photopolymer layer 3 is fixed on support layer 4, which is rolled up directly onto it, in this case by the intermediary of layer 40 of bonding material.

In this printing plate, therefore, support layer 4 also functions as a protective film for photopolymer layer 3.

This printing plate as well as the corresponding process for obtaining it therefore have the advantage of eliminating one of the two layers usually provided on both sides of the photopolymer layer. This inevitably lowers the cost of production of the printing plate and facilitates the process by which it is rolled up.

Referring now to FIG. 6, there is illustrated another version of the installation illustrated in FIG. 3.

This installation is provided with a support 7 for roll 70 while it is being formed and a cylinder 9 which guides support layer 4, provided on one side with a layer 48 of anti-adhesive material and on the other side with a layer 40 of bonding material.

Support 7 and cylinder 9 turn in opposite directions.

Photopolymer layer 3 is extruded by means 30.

Support layer 4 in turn is applied on its face situated toward the exterior of roll 70, layer 48 being in direct contact with layer 3.

Superposed layers 40, 4, 48 and 3 pass between roll 70 and cylinder 9, acting as a calender, and become rolled up on the roll while it is being formed.

Photopolymer layer 3 is then fixed on support layer 4, rolled up just before it, in this case via layer 40.

Roll 70 obtained is provided with the same layers as the roll illustrated in FIG. 4, but in the inverse order relative to support 7. The four layers are in fact disposed in the following pattern, starting at support 7 of the roll: photopolymer layer 3, layer 48 of anti-adhesive material, support layer 4 and layer 40 of bonding material.

As indicated above, the invention is not limited to this printing plate provided with four successive layers. In particular, the layer of anti-adhesive material and/or the layer of bonding material could be omitted. In addition, other layers could be deposited on the photopolymer layer before it is rolled up on coiling mechanism 5.

In all cases, the invention makes it possible to obtain a printing plate in the form of a roll, in contrast to the usual processes.

This configuration as a roll makes it possible to limit the losses during trimming of printing plates. In fact, the user can cut the plate to the desired length, resulting in a material savings of at least 10%.

Furthermore, the printing plate according to the invention is stored in more compact manner. This considerably reduces the space necessary on the user's premises for storage of printing plates before they are developed, and it also considerably reduces the cost of packages for transportation of these roll-type printing plates, and thus the transportation cost itself.

The reduction of the volume and weight of the package necessary for configuration of these plates also makes it possible to reduce the quantity of wastes to be eliminated.

Furthermore, by virtue of this configuration as a roll, the plate is naturally protected from accidental scratching.

Finally, in the second version illustrated in FIG. 4, the printing plate is provided with only one support layer, which also performs the function of a protective film, which reduces the cost of the plate still further.

The reference symbols appended to the technical characteristics specified in the claims are provided merely to improve understanding thereof without limiting the scope thereof.

The invention claimed is:

1. A process for obtaining a printing plate comprising at least a photopolymer layer (3) having two faces and a first layer (4) of a given material and constituting a support layer of said photopolymer layer and having two faces, said method comprising the steps of applying on one face of the support layer (4) a layer of pressure sensitive bonding material (40), rolling up said support layer (4) on said photopolymer layer to form a roll with said photopolymer layer (3) on said support layer (4), while causing said photopolymer layer (3) to come by one of its faces in contact with the face of the support layer (4), provided with said layer of pressure sensitive bonding material (40) at the beginning of the rolling up said rolling up of said polymer layer (3) and said support layer (4) generating a radial pressure between said layers in the roll, using said radial pressure to cause said pressure sensitive bonding material (40) to fix the photopolymer layer (3) to the support layer (4), whereas the face of the support layer (4), which is opposite the face provided with said pressure sensitive bonding material layer comes in contact with the face of the photopolymer layer opposite the face fixed to the support layer, the support layer (4) constituting thus a protective layer of the photopolymer layer.

2. A process according to claim 1 wherein said step of rolling up said support layer on said photopolymer layer is effected by concurrently feeding said support layer and said photopolymer layer separately and independently to a coiling mechanism.

3. A process according to claim 1, characterized in that it additionally comprises depositing, on the photopolymer layer (3), at least one other layer, and a compressible layer, before the actual rolling-up is performed.

4. A process according to claim 3, characterized in that it also comprises depositing a layer (48) of anti-adhesive material on the support layer (4) before the photopolymer layer (3) is formed on this layer (48) of anti-adhesive material.

5. A process according to claim 4, characterized in that the protective film is made of polyester.

6. A process according to claim 3, characterized in that the protective film is made of polyester.

7. A process according to claim 3, including the use of a roller (50) applying a pressure on the layers during the rolling operation.

8. A process according to claim 1, characterized in that it also comprises depositing a layer (48) of anti-adhesive material on the support layer (4) before the photopolymer layer (3) is formed on this layer (48) of anti-adhesive material.

9. A process according to claim 8, characterized in that the protective film is made of polyester.

10. A process according to claim 8, including the use of a roller (50) applying a pressure on the layers during the rolling operation.

11. A process according to claim 1, characterized in that the photopolymer layer (3) is obtained by extrusion, then calendered.

12. A process according to claim 11, characterized in that the protective film is made of polyester.

13. A process according to claim 11, including the use of a roller (50) applying a pressure on the layers during the rolling operation.

14. A process according to claim 1, characterized in that the protective film is made of polyester.

15. A process according to claim 14, including the use of roller (50) applying a pressure on the layers during the rolling operation.

16. A process according to claim 1, including the use of a roller (50) applying a pressure on the layers during the rolling operation.

17. A process for obtaining a printing plate adapted to be mounted on a support cylinder of a printing machine and comprising at least a photopolymer layer (3) having two faces and a first layer (4) of a given material and constituting a support layer of said photopolymer layer and having two faces, said photopolymer layer being bonded to one face of said support layer, whereas the other face of said photopolymer layer is adapted to receive removably a mask for irradiation for development, the face of the support layer opposite the face which is bonded to the photopolymer layer being adapted to be secured to a support cylinder, said method comprising the steps of, feeding a support layer (4) having on its face which is to be bonded to the photopolymer layer a layer (40) of pressure-sensitive bonding material covered by a removable protective sheet (42) to a coiling mechanism (5), removing said protective sheet from said pressure-sensitive bonding material layer (40) just before arriving at the coiling mechanism, feeding a photopolymer layer (3) to said coiling mechanism (5) so that at said coiling mechanism the face opposite the face to be bonded to the support layer is brought in contact with the face of the support layer, which is opposite the face to be bonded to the polymer layer, rolling up said polymer layer (3) and said support layer (4) so that within the roll formed thereby the pressure-sensitive bonding material layer is brought in contact with the face of the photopolymer layer (3) which is to be bonded to the support layer (4), developing radial pressure between the polymer layer and the support layer during said rolling up steps, using said radial pressure to cause said pressure sensitive bonding material (40) to fix the photopolymer layer (3) to the support layer (4), whereas in the roll the support layer constitutes a protective layer of the photopolymer layer by being in contact by its face opposite the bonded face with the face of the photopolymer layer which is opposite the bonded photopolymer layer face.

18. A method according to claim 17 wherein said steps of feeding the support layer and said photopolymer layer to the rolling mechanism comprises separately and independently introducing said layers to the rolling mechanism.

19. A process for obtaining a printing plate adapted to be mounted on a support cylinder of a printing machine and comprising at least a photopolymer layer (3) having two faces and a first layer (4) of a given material and constituting a support layer of said photopolymer layer and having two faces, a first face of said photopolymer layer (3) being bonded to a first face of said support layer and the second face opposite the first face being adapted to receive removably a mask for irradiation for development of the photopolymer layer and the second face of the support layer being adapted to be secured to the support cylinder, said method comprising the steps of feeding said support layer provided on its bonding face with a layer of pressure sensitive bonding material (40), covered by a protective sheet (42) and on its second face opposite the bonding face with a layer of anti-adhesive material (48) to a coiling mechanism (5), feeding the photopolymer layer (3) to said coiling mechanism (5), withdrawing the protective sheet from said bonding material layer (40) just before entry to said coiling mechanism (5), bringing the second face opposite the bonding face of the photopolymer layer in contact with the second face of the support layer covered by said layer of anti-adhesive material, rolling up the polymer layer (3) on the support layer (4) to form a roll in which the first face of the photopolymer layer (3) comes in contact with the bonding material layer (40) on the first face of the support layer (4) while generating a radial pressure between said layers in the roll and using said radial pressure to cause said pressure-sensitive bonding material (40) to fix the photopolymer layer (3) to the support layer (4), the support layer (4) constituting in the roll a protective layer of the photopolymer layer by its second face being in contact with the second face of the photopolymer layer, and the layer of anti-adhesive material (48) being transferred in the roll from said second face of the support layer to the second face of said polymer layer in order to adhere thereto due to a sticky property of the second face of the photopolymer layer.

20. A process according to claim 19 wherein said steps of feeding the support layer and the photopolymer layer to said coiling mechanism take place concurrently while supplying the two layers separately to the coiling mechanism.

* * * * *